United States Patent [19]
Cole et al.

[11] Patent Number: 5,166,609
[45] Date of Patent: Nov. 24, 1992

[54] ADAPTER AND TEST FIXTURE FOR AN INTEGRATED CIRCUIT DEVICE PACKAGE

[75] Inventors: Paul A. Cole; Bozidar Janko; Richard G. Chambers, all of Portland; Wolfgang H. Herr, Beaverton; Douglas W. Trobough, Beaverton; Peter M. Compton, Beaverton, all of Oreg.

[73] Assignee: Tektronix, Inc., Wilsonville, Oreg.

[21] Appl. No.: 530,141

[22] Filed: May 24, 1990

[51] Int. Cl.[5] .................. G01R 31/02; H01R 9/09
[52] U.S. Cl. ................ 324/158 F; 324/158 P; 439/68
[58] Field of Search ............. 324/158 F, 158 P, 725; 439/68, 70

[56] References Cited

U.S. PATENT DOCUMENTS

| | | | |
|---|---|---|---|
| 4,560,216 | 12/1985 | Egawa | 439/68 |
| 4,621,884 | 11/1986 | Berkebile, Jr. et al. | 439/68 |
| 4,645,279 | 2/1987 | Grabbe et al. | 439/68 |
| 4,657,324 | 4/1987 | Kamono et al. | 439/68 |
| 4,816,751 | 3/1989 | Selichi et al. | 324/158 F |
| 4,835,469 | 5/1989 | Jones et al. | 324/158 F |
| 4,866,374 | 9/1989 | Cedrone | 324/158 F |
| 4,996,476 | 2/1991 | Balyasny et al. | 324/158 F |

FOREIGN PATENT DOCUMENTS 0305951 8/1988 European Pat. Off. .

Primary Examiner—Ernest F. Karlsen
Attorney, Agent, or Firm—William K. Bucher

[57] ABSTRACT

A test fixture for a high pin count surface mounted IC device has a test head assembly connected to an adapter having electrically conductive elements that couple the output of the IC device to test points on the test head assembly. The test points are coupled to conductive pads on the test head assembly via conductive runs. The test head assembly conductive pads mate with conductive pad formed in the electrically conductive elements of the adapter. The conductive elements engage leads on the IC device providing conductive paths between the IC leads an the test points on the test head assembly. The test fixture is secured to the IC device by friction forces between the periphery of the IC device and the inner surface of the adapter. The test fixture or the adapter is usable as a low profile chip carrier by inverting the fixture or adapter and as a circuit board interconnect.

5 Claims, 9 Drawing Sheets

ADAPTER AND TEST FIXTURE FOR AN INTEGRATED CIRCUIT DEVICE PACKAGE

BACKGROUND OF THE INVENTION

The present invention relates to a test fixture for an integrated circuit IC device and more specifically to a test fixture adapted for use with high pin count surface mounted devices.

Surface mount technology SMT is increasing being used in the electronic industry to produce high pin count, small dimensioned IC devices. The pins of the SMT device are soldered directly to conductive runs on a circuit board. The distance between pin centers for these types of devices are generally in the range of 0.025 inches producing a much higher pin density than in previous types of IC devices. This higher pin density makes it much more difficult to probe and test these devices. For example, the 80386 microprocessor chip, manufactured by Intel Corp., has one hundred pins positioned around the periphery of the chip on 0.025 inch centers.

During the development and testing of new IC devices, such as the 80386 microprocessor, in-circuit emulation of the device is performed with the chip removed from the circuit. Removing a SMT device from a circuit board can easily produce damage to the device or the circuit board. For this reason, chip carriers are used for mounting the device on a circuit board. An example of such a chip carrier for a 80386 microprocessor is manufactured by Minnesota, Mining & Manufacturing, 3M, under Part No. 2-0100-07243-003-018-000. The chip carrier mounts on the circuit board and the chip device is placed within a recess formed in the carrier. A coverplate is placed over the chip and snap fitted into place to secure the device in the carrier. Individual pins of the device mate with coextensive conductor wires that are soldered to the circuit board. During in-circuit emulation of the device, the IC device is removed from the 3M chip carrier and a in-circuit-emulation test head assembly, developed by the assignee of the present invention and sold by Intel, Corp. under the name Hinge Cable Assembly with Part No. 457451-001, is used to target the 3M chip carrier. The test head assembly has a flex-circuit cable with a coverplate adapter on one end and a probe head on the other. The flex-circuit cable is secured in the coverplate adapter so that electrically conductive pads formed on the flex-circuit cable are aligned with the corresponding conductor wires of the chip carrier. The coverplate adapter replaces the coverplate of the chip carrier socket. The probe head has contacting points thereon in a pattern corresponding to the pin out pattern of the displaced IC that allows probing without the attendant risk of shorting pins. In use, the test head assembly couples externally-generated signals into the chip carrier socket as though the chip were present from an instrument which provide outputs to simulate operations of the displaced IC. The Intel embodiment targets a system in which a socketed device is removed.

Another disadvantage of using chip carriers, such as the 3M device, is the high profile that the carrier has on the circuit board. Elimination of the chip carriers would allow closer spacing of circuit boards in addition to the attendant cost saving with a reduction in parts.

At present no test fixture exists for probing an in-place, operating device. What is needed is a test fixture for use with SMT IC devices that provides in-circuit monitoring and/or emulation with the IC device in place.

SUMMARY OF THE INVENTION

Accordingly the present invention is a test fixture for emulating and/or monitoring an in circuit integrated circuit IC device. The test fixture has a test head assembly and an adapter having electrically conductive elements disposed therein for electrically connecting the test head assembly to the IC device. The adapter has a housing having a top and engaging means extending therefrom that are complementary to the periphery of the IC device. The engaging means has sidewalls normal to the top of the housing and coextensive coverplates for securing the electrically conductive elements within the sidewalls. The sidewalls have inner and outer surfaces with a solid first portion adjacent to the top of the housing having inwardly angled grooves formed normal to the top on the outer surfaces. A second portion is formed adjacent to the first having a comb structure of alternating ribs and slots with the slots being co-linear with the grooves in the solid first portion. The electrically conductive elements fit within the grooves of the first portion and extend through the slots of the second portion with the ribs of the comb structure providing electrical isolation between the conductive elements. The electrically conductive elements have one end engaging the leads of the device and the other end forming electrically conductive pads for mating with corresponding electrical contact pads on a test head assembly. The adapter is secured to the device by friction pressure developed between the inner surface of the sidewalls and the periphery of the device. Alternately, an external clip is provided for securing the adapter to the device.

The electrically conductive pads of the test head assembly are formed on a flexible circuit member and connected to test points via conductive runs formed in the member. In one configuration, the test points are positioned over the adapter by sandwiching the flexible circuit member between a support member containing the test points and a base member around which the flexible circuit member is folded. The conductive pads of the test head assembly mate with the corresponding conductive pads of the adapter providing a conductive path from the IC device to the test points. Alternately, the flexible circuit member is a flex-circuit cable used to laterally position the support member away from the adapter. One end of the cable contains the conductive pads and is secured to the base member while the other end is secured to the support member. Electrical conductivity between the adapter and the test points on the support member is via the conductive runs in the cable. The support member is provided with either active or passive circuitry for passing electrical signals to and from the IC device.

The objects, advantages and novel features of the present invention are apparent from the following detailed description when read in conjunction with the appended claims and attached drawings.

DETAILED DESCRIPTION OF THE PREFERRED EMBODIMENT

Figure 1:
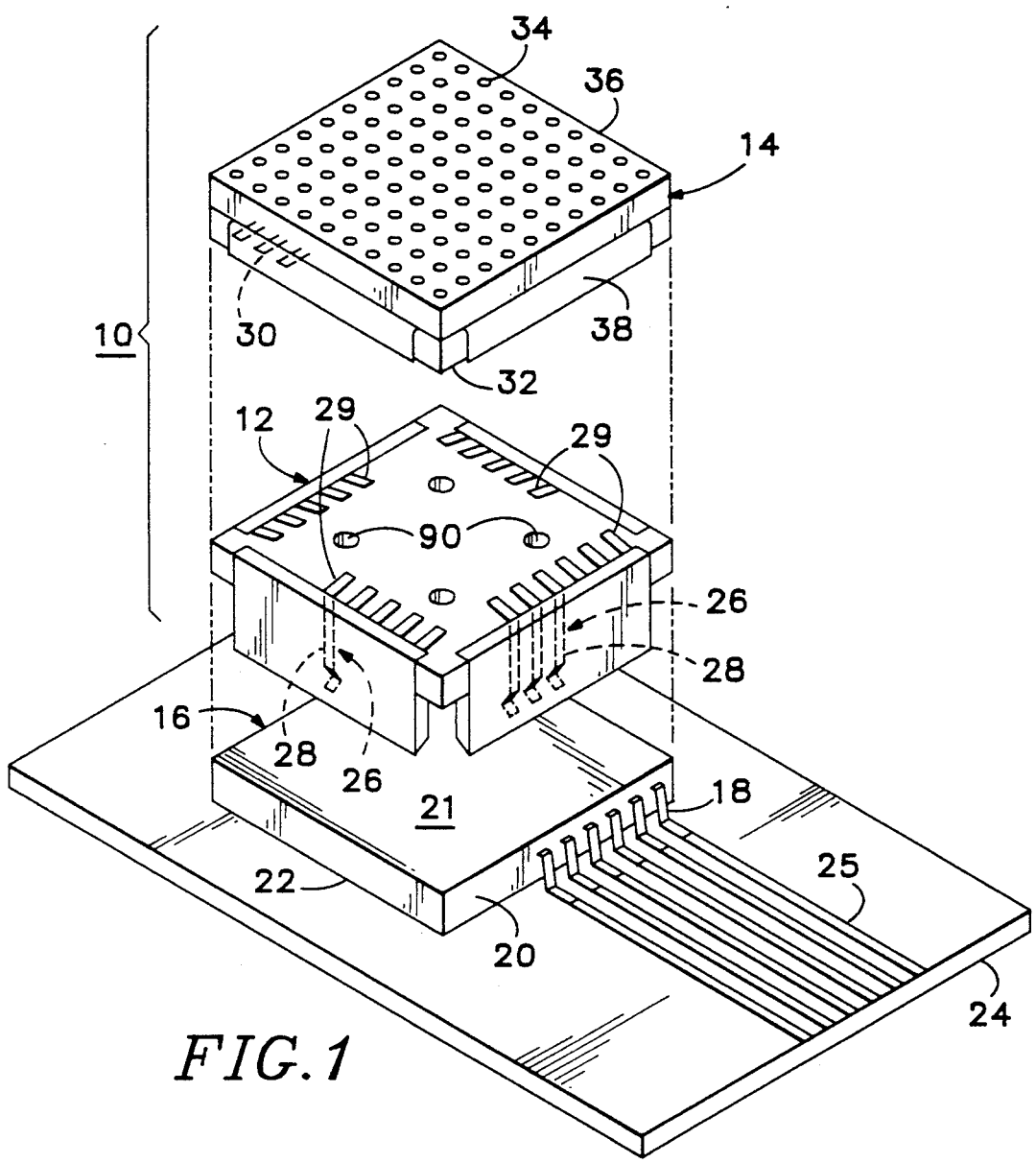
FIG. 1 is an exploded, perspective view of the test fixture according to the present invention.

Referring to FIG. 1, there is shown an exploded, perspective view of a test fixture 10 having an adapter 12 and a test head assembly 14. The test fixture adapter 12 is positioned on an IC device 16 that is mounted on a substrate 24. The adapter provides multiple electrically conductive paths between the IC device 16 and the test head assembly 14, or other types of mating devices.

The test fixture 10 can be used with any IC device 16 having electrical leads 18, also called legs or pins, extending from its periphery 20. Examples of such devices are found in the Plastic Quad Flat Pack, PQFP, family of integrated circuit devices. These types of devices have a square plastic body with top and bottom surfaces 21 and 22, and leads 18 extending from the sides 20 of the device. PQFP devices can have lead counts ranging from less than forty-four to more than one hundred and ninety-six leads with the leads usually being equally distributed around the periphery of the devices. The spacing between lead centers on these devices are 0.025 inches. A similar family of devices are manufactured using metric dimensions. The test fixture 10 of the present invention will work equally well with both family types by adjusting the dimensions of the adapter 12 elements.

The PQFP family of devices 16 are designed for mounting on a substrate 24, such as a circuit board, using surface mount technology. The leads 18 of IC device 16 are soldered directly to conductive runs 25 on the circuit board 24. The adapter 12 of test fixture 10 fits over the IC device 16 and has electrically conductive elements 26 secured therein providing conductive paths between leads 18 and electrically conductive pads 30 on the base member 32 of the test head assembly 14. Each electrically conductive element 26 has an electrical contact lead segment 28 that engages a lead 18 extending from device 16 and a electrical contact pad segment 29 that mates with a coextensive electrically conductive pad 30 on the test head assembly 14. The conductive pads 30 of test head assembly 14 are coupled to test points 34 on a support member 36 via a flexible circuit member 38 having conductive runs formed thereon. The test fixture provides electrical continuity from the leads 18 of the IC device 16 to the test points 34 on the support member 36 of the test head assembly 14.

The primary use for the adapter 12 is to provide multiple conductive paths between the leads 18 of IC device 16 and the test head assembly 14. However, any circuit product can be mated with the adapter 12 as long as the electrical contacts of the circuit product are arranged in the same pattern as the conductive pads 29, the mating product is rigid enough to compress the conductive pads 29, and a means is provided to retain the circuit product in contact with the adapter 12.

Figure 2:
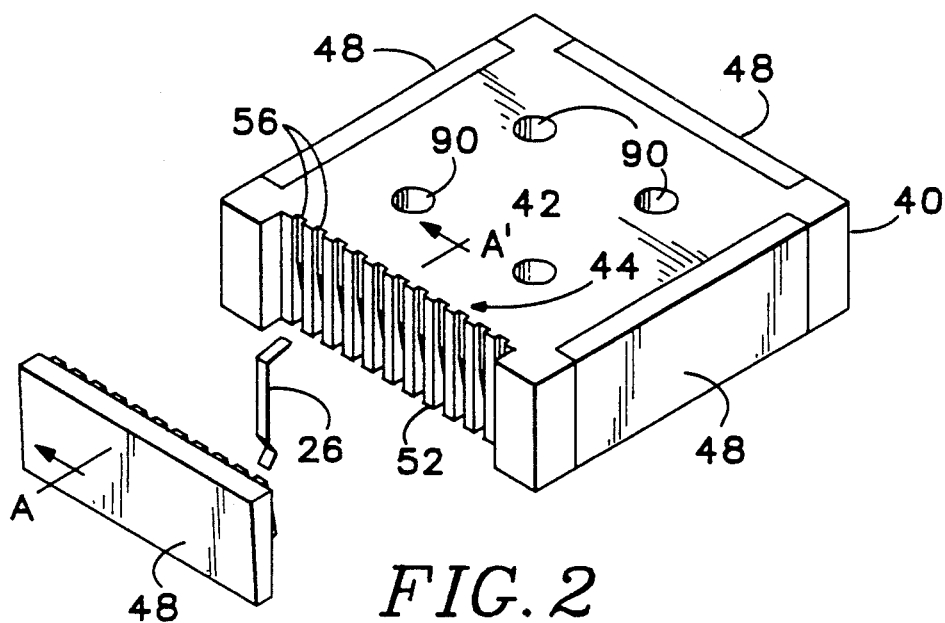
FIG. 2 is an exploded view of the test fixture adapter according to the present invention.
Figures 3A, 3B:
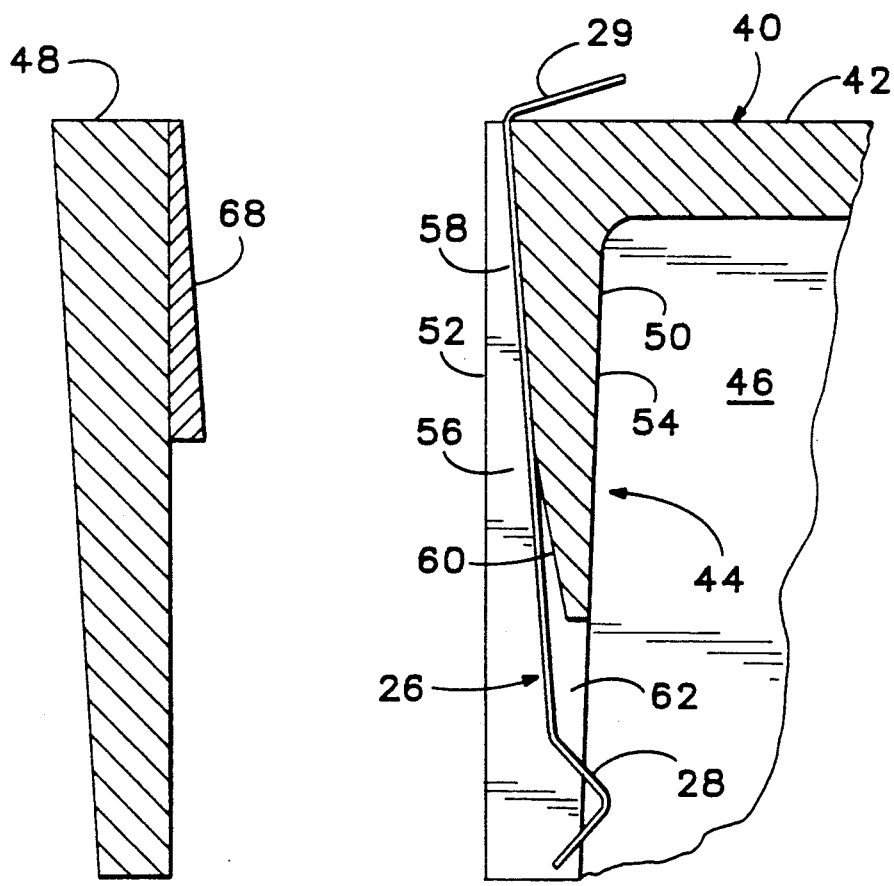
FIGS. 3A-3B are cross-sectional views along line A—A' of the test fixture adapter according to the present invention.
Figure 4A:
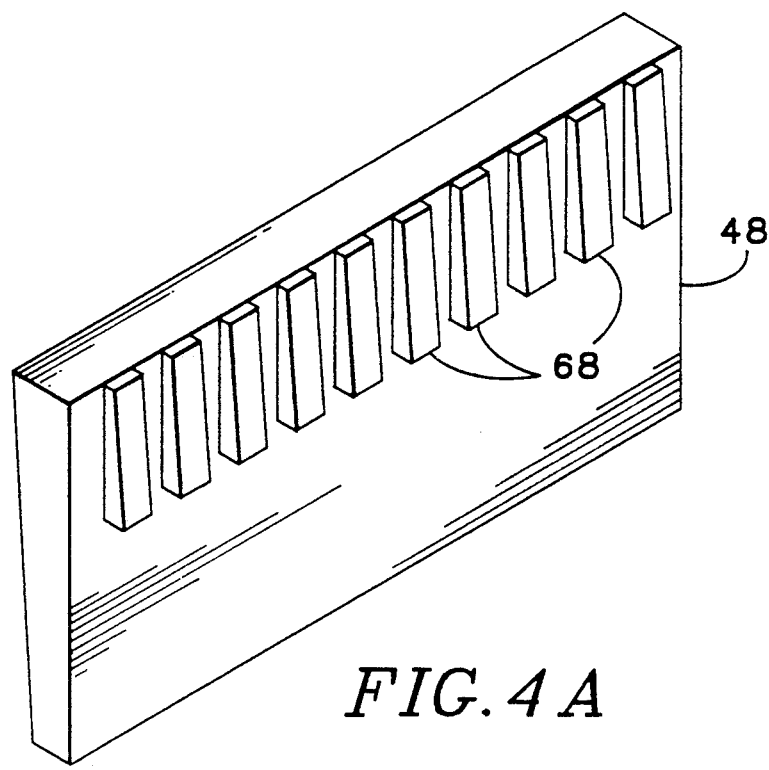
FIGS. 4A-4B are detailed views of portions of the test fixture adapter according to the present invention.
Figure 4B:
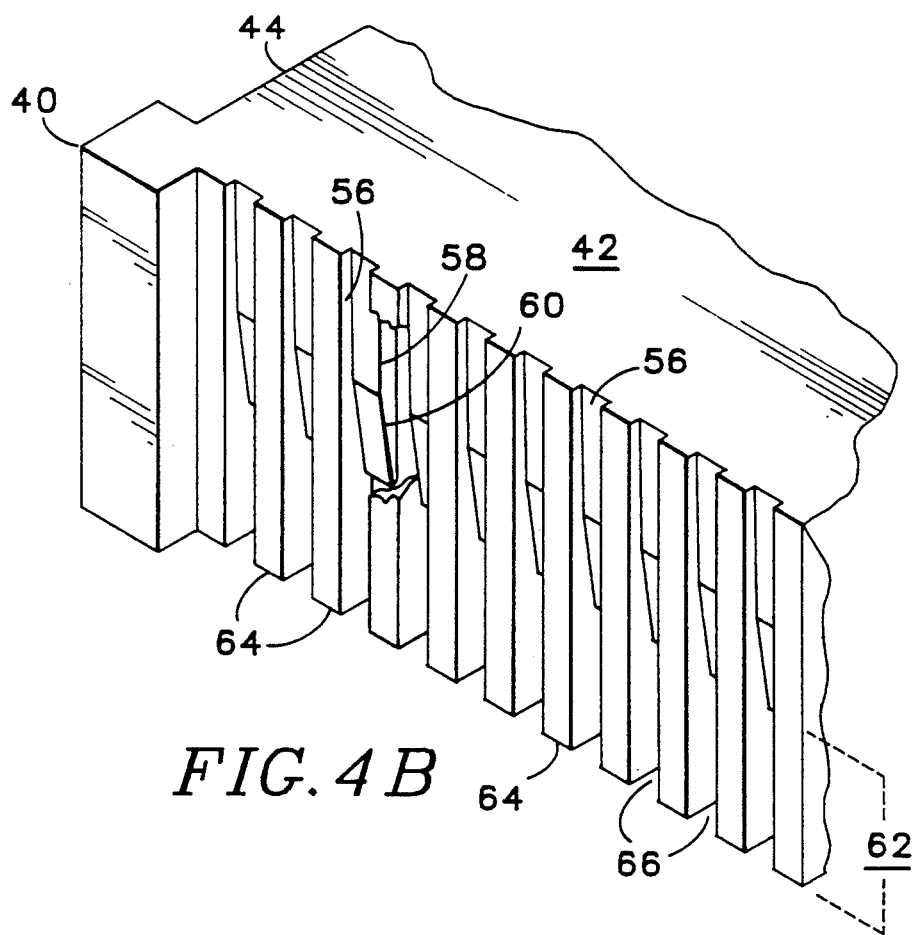

Adapter 12 is described in greater detail with reference to FIGS. 2-4. Adapter 12 has a housing 40 generally conforming to the size of the IC device 16. The housing has a top 42 and vertically depending sidewalls 44 forming a cavity 46 into which the IC device 16 fits. Mating with the sidewalls 44 are coextensive coverplates 48 that secure the electrically conductive elements 26 within the housing 40. The cross-sectional view along line A—A' show in greater detail the structure of the sidewalls 44 and the coverplates 48 that provide the means for engaging the elements 26 within the adapter 12. The sidewalls 44 have inner and outer surfaces 50 and 52, and a solid portion 54 adjacent to the top 42. The outer surfaces 52 of the solid portion 54 have grooves 56 formed therein that are normal to the top 42. The grooves have first and second inwardly angled sections, 58 and 60, with the second section 60 being angled to a greater degree than the first section 58. The sidewalls 44 have a second portion 62 adjacent to the solid portion 54 where the grooves extend through the sidewalls 44 forming a comb structure of ribs and slots 64 and 66. Elements 26 fit into the grooves 56 and extend through the slots 66 exposing the electrical contact lead segments 28 within the adapter cavity 46. The ribs 64 provide electrical isolation between adjacent contact lead segments 28. The coverplates 48 have outwardly angled protrusions 68 thereon that mate with the grooves 56 formed in the solid portion 54 of the sidewalls 44. The mating of the coverplates 48 with the sidewalls 44 secure the electrically conductive elements 26 within the sidewalls 44.

Figure 5:
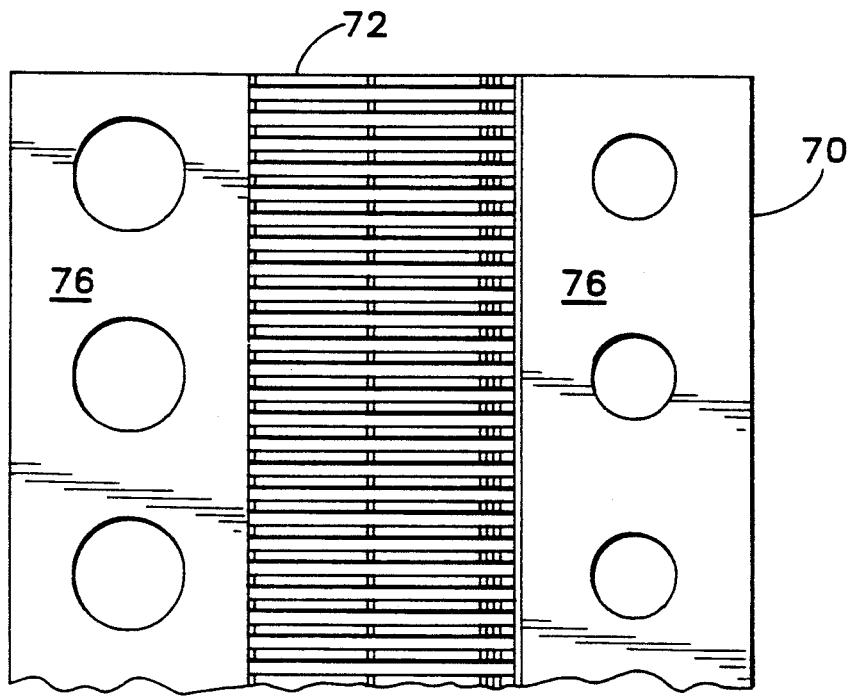
FIG. 5 is a plan view of electrically conductive blanks used in forming electrically conductive elements according to the present invention.
Figure 6:
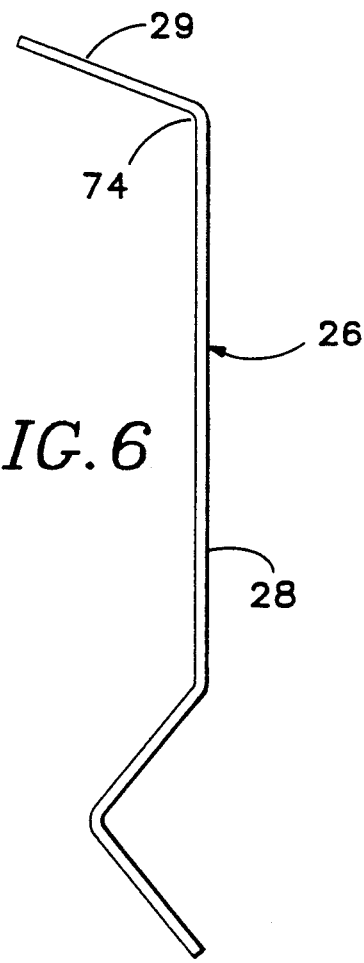
FIG. 6 is a side view of the electrically conductive element according to the present invention.

The electrically conductive elements 26 are formed from a solid sheet of phosphor bronze alloy 70 that is chemically etched to form element blanks 72 as shown in FIG. 5. To prevent oxidation and enhance connection performance, the blanks 72 are plated with a 0.00005 inches thick layer of gold over a 0.0002 inches thick layer of nickel. Other types of plating and methods of manufacture are available for making the electrically conductive elements and are well known in the electrical conductor manufacturing art. The blanks 72 are then shaped into the electrically conductive elements 26 by bending the blanks 72 to form the electrical contact pad segments 29 and the electrical contact lead segments 28 as shown in FIG. 6. The angle 74 between segments 28 and 29 is greater than ninety degrees so that the electrical contact pads 29 segments protrude above the top 42 of the adapter 12 when secured in the sidewalls 44. The bending of the blanks 72 impart a spring bias in segments 28 and 29 so that when assembled pressure is maintained between contact pads 29 and 30 of the adapter 12 and the test head assembly 14, respectively. Further, the electrical contact lead segments 28 are spring biased to provide wiping engagement of the IC device leads 18 as the test fixture is placed over the IC device 16. The etched and formed sheets 70 are placed in the grooves 56 of sidewalls 44 and the coverplates 48 are secured to the sidewalls by sonic welding or other such conventional methods. Excess blank material 76 is removed leaving the electrical conductive elements 26.

Figure 7:
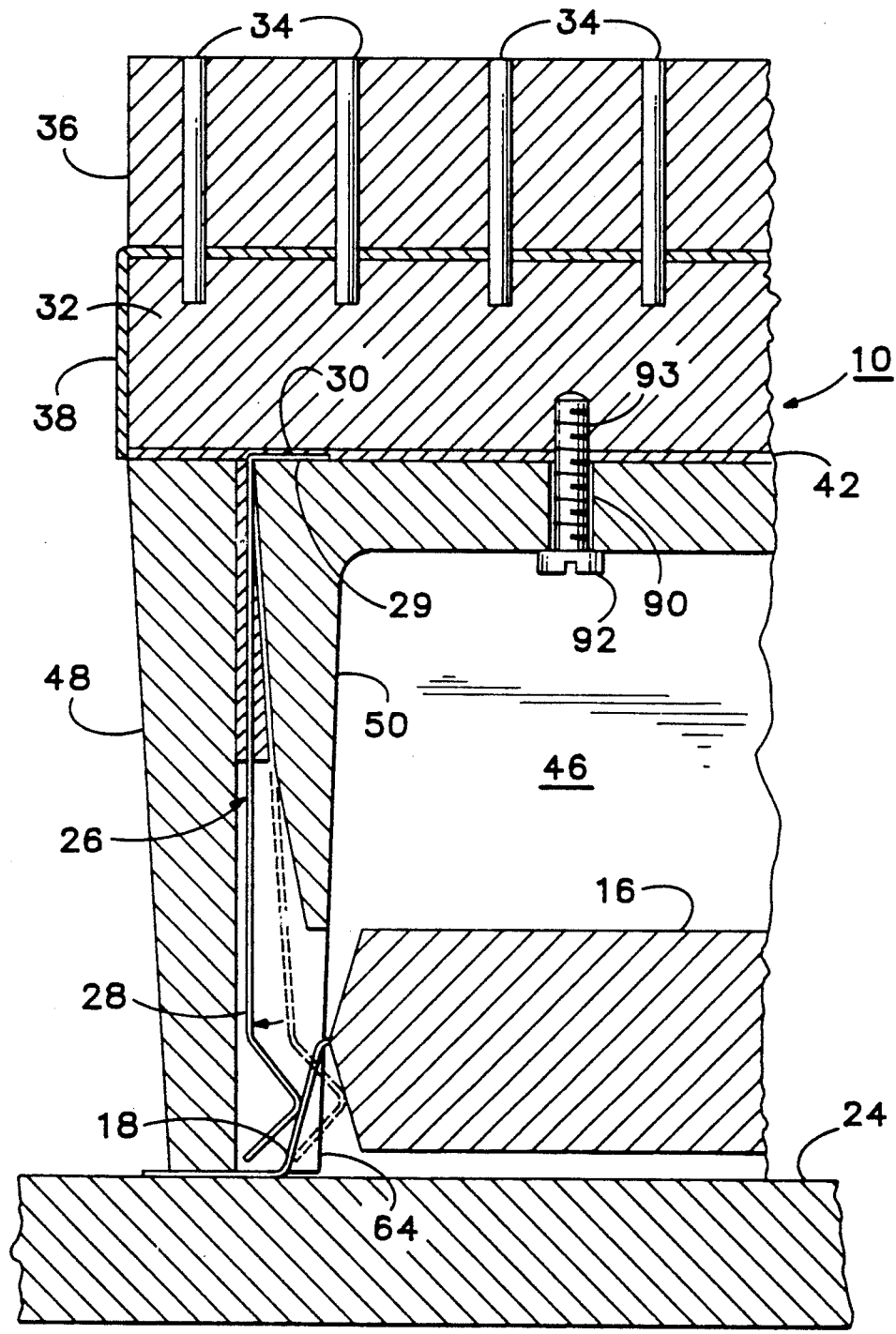
FIG. 7 is a cross-sectional view of the test fixture according to the present invention mounted on an IC device.

Referring to FIG. 7, there is shown in cross-sectional view the test fixture 10 positioned on the IC device 16. Through holes 90 are formed in the adapter 12 for accepting screws 92 that threadably engage threaded screw holes 93 in the base member 32 of adapter 12 for securing adapter 12 to the base member 32 and providing mating contact between the contact pads 29 of the adapter 12 and the contact pads 30 of test head assembly 14. The inner surface 50 of the adapter 12 in the form of the ribs 64 mate with the periphery of the IC device 16 producing frictional forces that hold the test fixture on the IC device 16. The electrically conductive elements 26 provide electrical continuity between the IC device 16 and the test head assembly 14 via the electrical conductive leads 28 engaging the IC leads 18 and the electrical contact pads 29 mating with the electrical contact pads 30 of the test head assembly 14. Improper tightening of screws 92 can cause intermittent contact between conductive pads 29 and 30. An electrically conductive Z-axis elasometic material, such as sold by Shinitsu of America, Inc. or other such types of materials, can be positioned between the electrically conductive pad 29 and 30 to compensate for this problem and maintain electrical contact between the pads.

Figure 8:
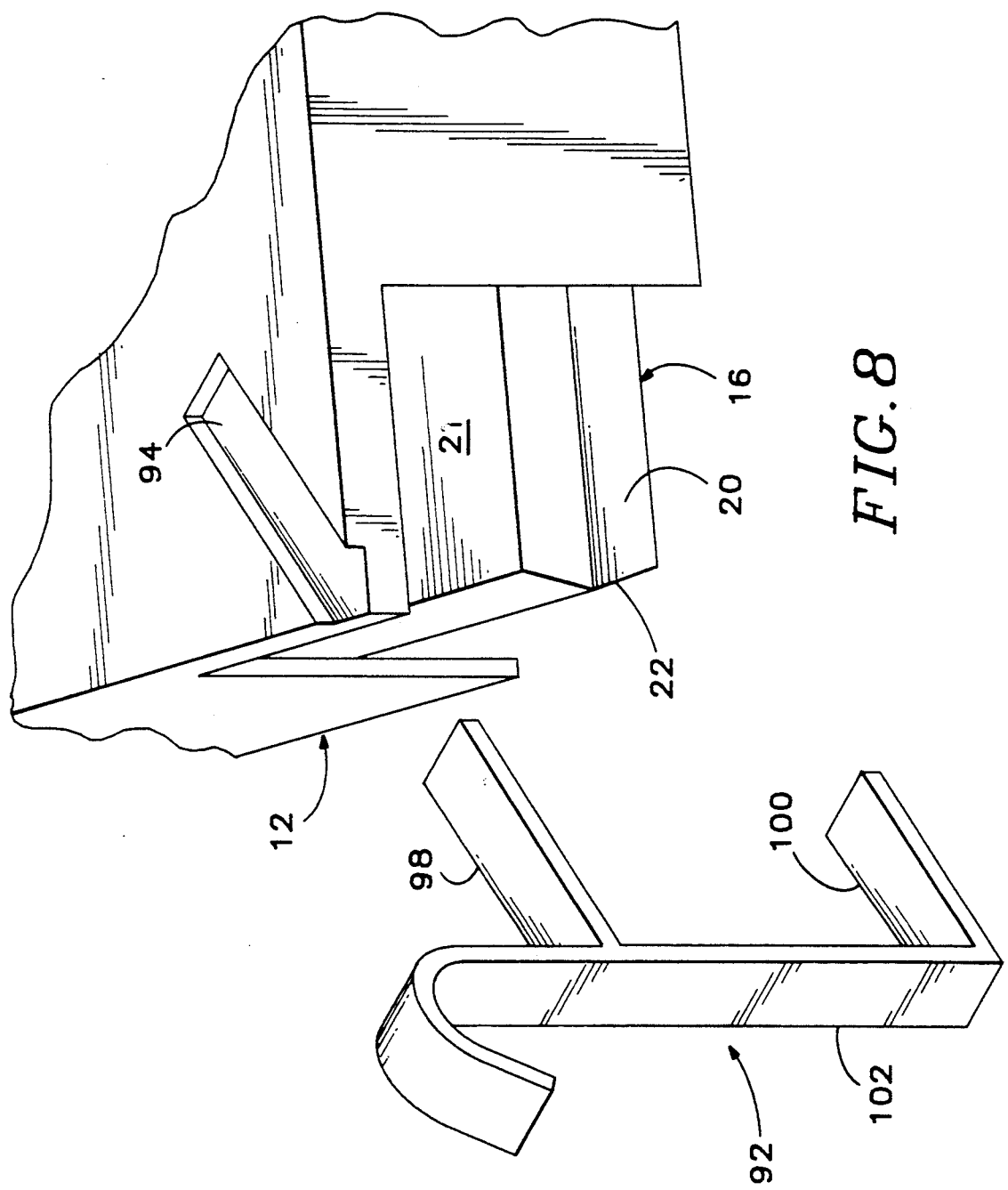
FIG. 8 is an alternate securing device for the test fixture according to the present invention.

An alternative method of securing the test fixture 10 to the IC device 16 is shown in FIG. 8. Notches 94 are formed at the corners of the adapter 12 for accepting locking clips 96. Each locking clip 96 has a engaging pin 98 and a locking pin 100 in the form of protrusions that are normal to a handle 102. After the test fixture 10 is positioned on the IC device 16 the locking clip 96 is positioned so that the engaging pin slidably mates with the notch 94 in the adapter 12 and the locking pin engages the bottom surface 22 of the IC device 16.

Figure 9A:
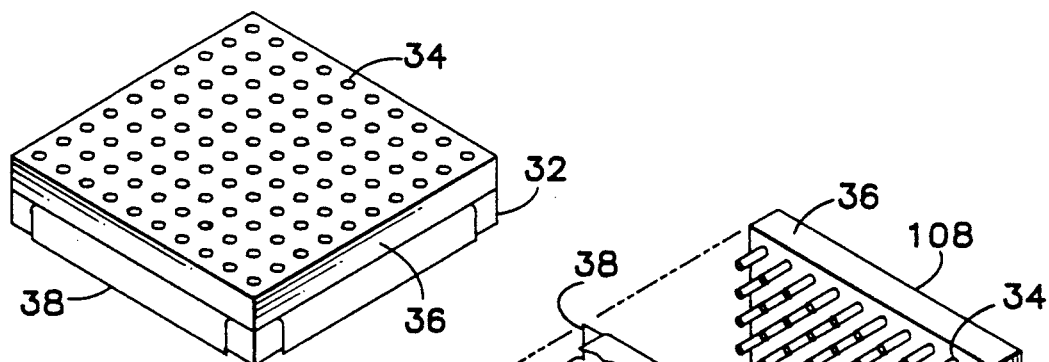
FIG. 9A is a perspective view of the test head assembly according to the present invention.
Figure 9B:
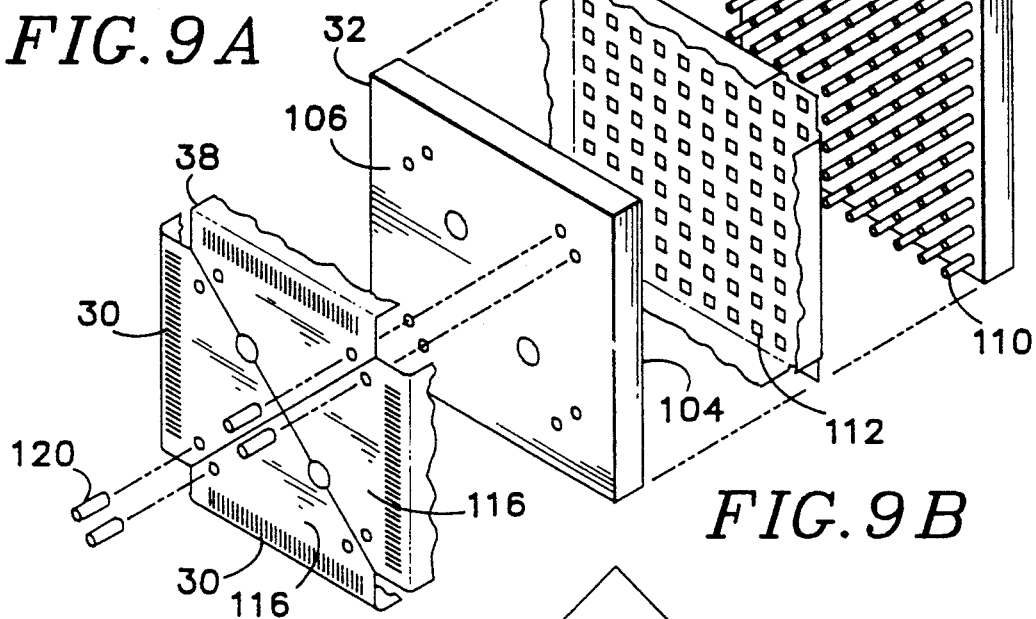
FIG. 9B is an exploded perspective view of the test head for the test fixture according to the present invention.
Figure 9C:
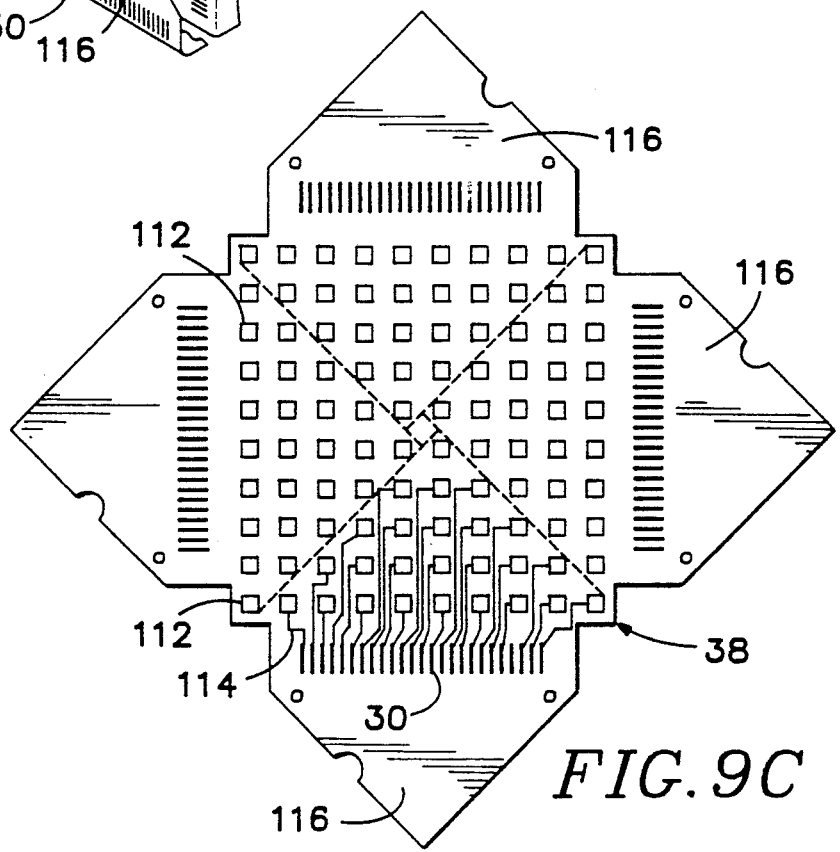
FIG. 9C is a plan view of the flexible circuit member of the test head for the test fixture according to the present invention.

The test head assembly 14 is described with reference to FIGS. 9A, 9B, and 9C. The base member 32 is formed of an insulative material, such as an injected molded plastic or the like, and is generally rectilinear in shape with top and bottom surfaces 104 and 106. The support member 36 is formed of an insulative material and has an array of test points 34, such as solid conductive wires, conductive sleeves or the like, extending there through. The support member 36 has opposed parallel surfaces 108 and 110 with the test points 34 protruding from the surface 110 that contacts the flexible circuit member 38. When solid conductive wires are used the test points 34 extend beyond both surfaces 108 and 110 of the support member 36. When conductive sleeves are used, they are generally mounted flush with surface 108 of the support member 36. The test points 34 accept external probing devices, such test probes, lead sets or the like, for coupling electrical signals to and from the IC device to a piece of testing equipment. The flexible circuit member 38 has an array of through holes 112 formed therein that match the test point 34 array on the support member 36. Soldering pads are associated with each through hole for soldering the test points 34 to the flexible circuit member 38. Extending from the solder pads are electrically conductive runs 114 that connect the test points 34 to the electrically conductive pads 30 formed on the flexible circuit member 38. The flexible circuit member 38 is wrapped around the base member 32 so that the conductive pads 30 are exposed along or near the periphery of the base member 32. The conductive pads 30 are accurately positioned using positioning pins 120 half of which are shown). The flexible circuit member 38 is secured to the bottom surface 106 of the base member 32 using any number of affixing techniques.

The flexible circuit member 38 has a generally rectilinear form with the through hole 112 array and the conductive pads 30 rotated forty-five degrees from sides of the flexible circuit member 38 forming wings 116 at the corners of the member 38. The conductive pads 30 are gold contacts that have conductive runs 114 extending to the through holes 112. Orthogonal lines roughly bisecting the sides of the flexible circuit member 38 produces four quadrants that have conductive pads 30, through holes 112 and conductive runs 114 which identical patterns. This simplifies the design and construction of member 38.

Figure 10:
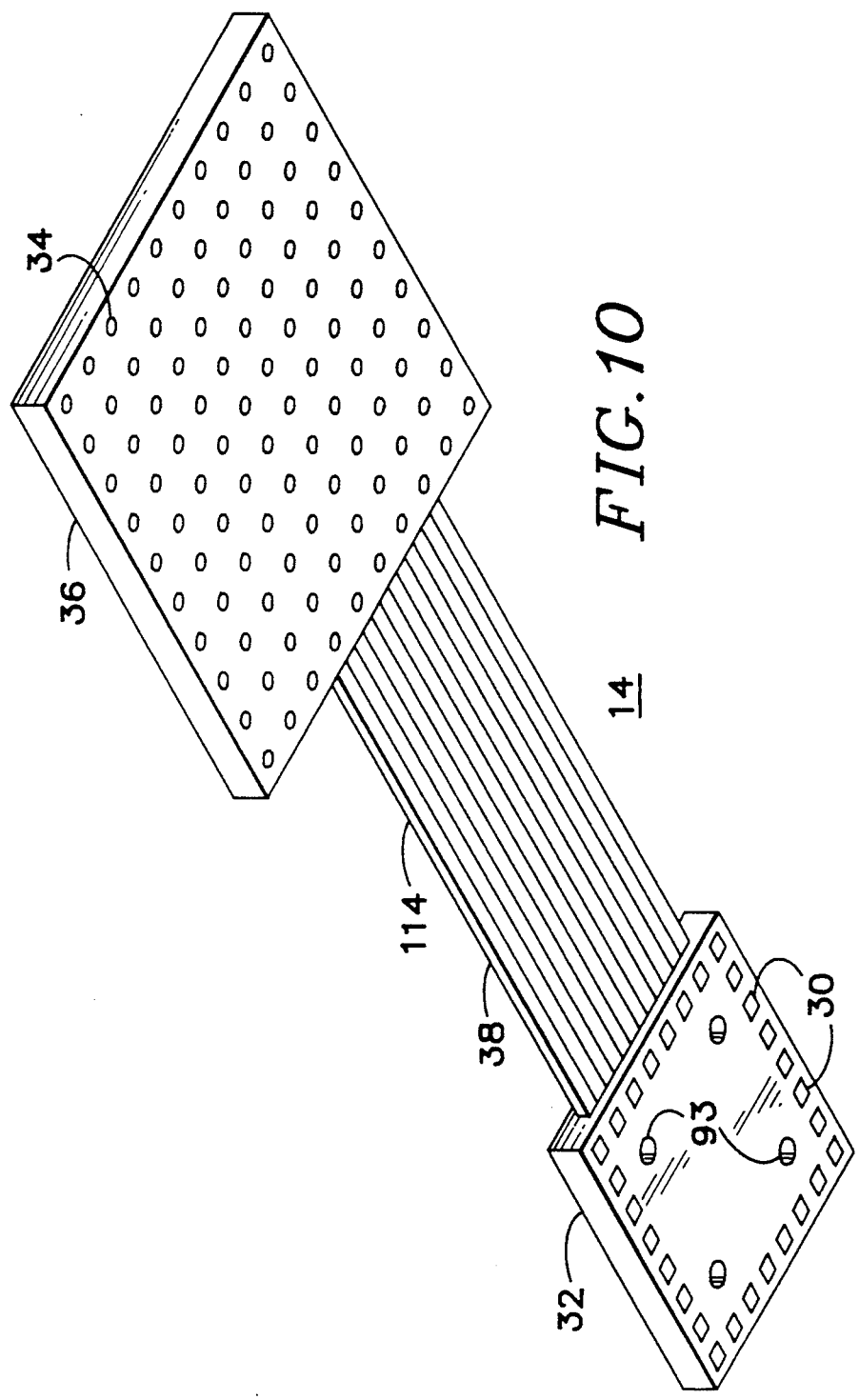
FIG. 10 is a perspective view of an alternate test head assembly for use in the test fixture according to the present invention.

Referring to FIG. 10, there is shown an alternative test head assembly 14 wherein the flexible circuit member 38 is a flexible circuit cable laterally positioning the support member 36 away from the adapter 14. The end of the flexible circuit member 38 containing the electrically conductive pads 30 is secured to the base member 32. The other end of the flexible circuit member 38 is secured to the support member 36. As previously described, the test points 34 in the support member 36 are soldered to soldering pads associated with through holes in the flexible circuit member 38. The conductive pads 30 on the base member are electrically connected to the soldering pads on the support member via conductive runs on the flexible circuit member 38.

The test fixture 10 of the present invention is usable as a low profile chip carrier by inverting the fixture and affixing it to a substrate, such as a circuit board or other circuit product. The solid wire test points 34 of the test head assembly 14 are electrically connected to through holes in the circuit board that have conductive runs extending therefrom. The IC device 16 is inverted and placed in the adapter of the test fixture. In a further adaptation of the present invention, the adapter 12 itself is secured to a circuit board and perform as a chip carrier. Conductive runs on the circuit board terminate in conductive pads that mate with the conductive pads 29 of the electrically conductive elements 26.

Figure 11:
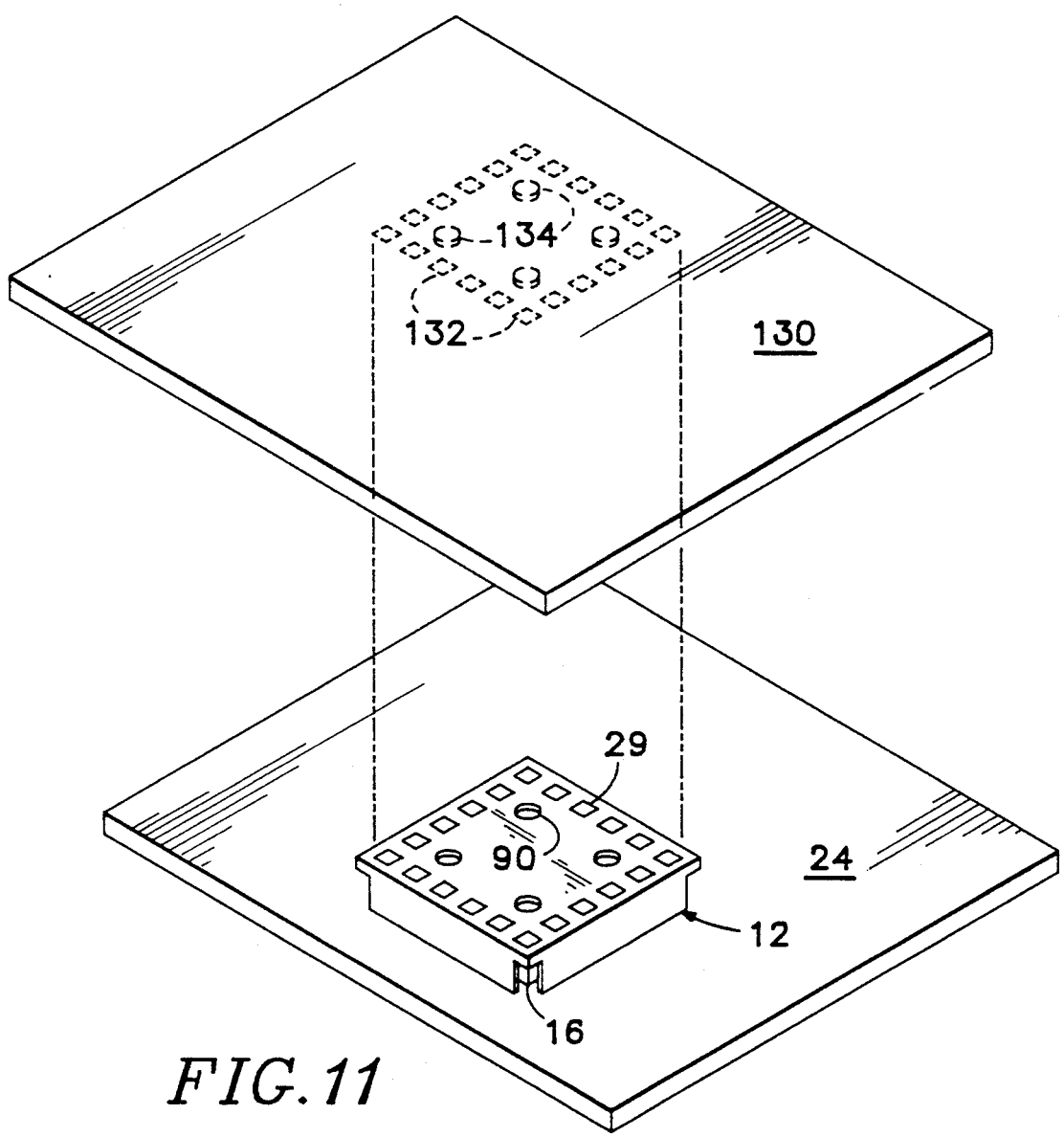
FIG. 11 is a perspective view of a circuit board interconnect system according to the present invention.

An further embodiment of the present invention on shown in FIG. 11 where the adapter 12 is used as a circuit board interconnect between circuit board 24 and circuit board 130 providing parallel coupling of signals to and from the integrated circuit device 16 to circuit board 130. The adapter 12 is placed on the device 16 providing electrical continuity between the leads on the device and pads segments 29 on the adapter 12 as has been previously described. The second circuit board 130 has electrical contact pads 132 formed thereon in a pattern coextensive with the pads segments 29 on the adapter 12. The second circuit board 130 is secured to the adapter 12 using screws or other well known fastening means inserted through apertures 134 in the circuit board 130. The contacts pads 132 on the second circuit board 130 mate with the pad segments 29 on the adapter 12.

A further adaption of the circuit board interconnect embodiment uses a modification of the test head assembly 14 as shown in FIG. 10. The support member 36 is modified to resemble the base member 32. The solder pads on the flexible circuit member 38 are replaced with conductive pads similar to the contact pads 30 associated with the base member 32. The base member 32 is secured to the adapter 14 as previously described and the modified support member 36 is secured to the second circuit board 130 with the contact pads on the support member 36 mating with the contact pads 132 on the circuit board 130. The circuit board interconnect of this design allows the second circuit board 130 to spaced away from the first circuit board 24 while at the same time providing parallel coupling of signals to and from the integrated circuit device 16.

A test fixture has been described wherein a test head having an array of test points is electrically coupled to an IC device via electrically conductive elements disposed within a housing of an adapter. The adapter housing has grooves formed in sidewalls that produce a comb structure of alternating slots and ribs. The ribs provide separation between adjacent conductive elements and a means for securing the adapter and hence the test fixture to the IC device. These and other aspects of the present invention are set out in the appended claims.

We claim:

1. An adapter for a surface mounted integrated circuit device wherein the integrated circuit device has top and bottom surfaces and a periphery from which electrically conductive leads extend that are soldered directly to conductive runs on a substrate, the adapter comprising:

a housing positionable on the integrated circuit device mounted directly on the substrate having a top and vertically depending sidewalls with inner and outer surfaces, the top and inner surface sidewalls forming a cavity for receiving the integrated circuit device;

electrically conductive elements disposed within the housing with each element having one end being exposed within the cavity for engaging one of the leads of the surface mounted integrated circuit device and the other end forming an electrical contact pad that is exposed on the top of the housing;

coverplates coextensive with the outer sidewall surfaces for securing the electrically conductive elements within the housing; and means for securing the housing on the surface mounted integrated circuit device.

2. The adapter as recited in claim 1 wherein each sidewall further comprises a solid portion adjacent to the top with inwardly angled grooves formed in the outer surface normal to the top and a second portion adjacent to the solid portion wherein the grooves extend through the sidewall forming a comb structures having alternating ribs and slots with the electrically conductive elements fitting within the grooves of the solid portion and extending through the slots in the second portion, the ribs of the comb structure providing electrical isolation between the conductive elements.

3. The adapter as recited in claim 1 wherein each electrically conductive element further comprises a first segment angularly depending from a second segment with the angle between the segments being greater than ninety degrees, the first segment being the electrical contact pad and the second segment engaging one of the device leads.

4. The adapter as recited in claim 1 wherein the securing means comprises the inner surface of the sidewalls mating with the periphery of the surface mounted integrated circuit device producing frictional forces for holding the adapter in place.

5. The adapter as recited in claim 1 wherein the securing means comprises a locking clip having a handle, engaging pin and locking pin with the pins being normal to and extending from the handle in the same direction, the engaging pin slidably mating with the housing and the locking pin slidably mating with the bottom surface of the surface mounted integrated circuit device.

* * * * *